United States Patent
Hayashi

(10) Patent No.: US 8,036,060 B2
(45) Date of Patent: Oct. 11, 2011

(54) SEMICONDUCTOR DEVICE IN WHICH A MEMORY ARRAY IS REFRESHED BASED ON AN ADDRESS SIGNAL

(75) Inventor: Koichiro Hayashi, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 164 days.

(21) Appl. No.: 12/427,237

(22) Filed: Apr. 21, 2009

(65) Prior Publication Data

US 2009/0201751 A1    Aug. 13, 2009

Related U.S. Application Data

(62) Division of application No. 11/580,895, filed on Oct. 16, 2006, now Pat. No. 7,545,697.

(30) Foreign Application Priority Data

Oct. 18, 2005   (JP) ................................. 2005-303385

(51) Int. Cl.
*G11C 7/00* (2006.01)
(52) U.S. Cl. ...................... 365/222; 365/233.1; 365/236
(58) Field of Classification Search ................... 365/222, 365/233.1, 236
See application file for complete search history.

(56) References Cited

U.S. PATENT DOCUMENTS

| | | | |
|---|---|---|---|
| 5,566,119 A | 10/1996 | Matano | |
| 6,809,990 B2 | 10/2004 | Thomann et al. | |
| 6,937,534 B2 | 8/2005 | Lim et al. | |
| 6,988,218 B2 * | 1/2006 | Drexler | ......................... 713/600 |
| 7,082,072 B2 | 7/2006 | Dono et al. | |
| 2002/0039323 A1 * | 4/2002 | Tokutome et al. | ............ 365/233 |
| 2005/0078539 A1 | 4/2005 | Schoenfeld et al. | |
| 2006/0004954 A1 * | 1/2006 | Fang et al. | .................... 711/106 |

FOREIGN PATENT DOCUMENTS

| | | |
|---|---|---|
| JP | 08-138374 A | 5/1996 |
| JP | 2005-158158 A | 6/2005 |

* cited by examiner

*Primary Examiner* — Hoai Ho
(74) *Attorney, Agent, or Firm* — Sughrue Mion, PLLC

(57) ABSTRACT

In an SDRAM of reduced current consumption, a signal RAS for performing refresh while temporally splitting refresh becomes active N times (where N is an integer and N∈2 holds) in a single refresh time period (indicated by a signal REF) to thereby refresh an internal memory array successively. The SDRAM includes a DLL circuit for aligning phase of an internal clock signal with that of an external clock signal that is externally supplied, and a DLL control circuit for exercising control so as to halt operation of the DLL circuit in an interval in which the address signal becomes active one or more times and N−1 times or fewer, this interval being included in an interval in which the signal RAS becomes active N times. The DLL control circuit counts the signal RAS and decodes the value of the count. Operation of the DLL circuit is halted while a prescribed range of count values is being decoded.

8 Claims, 25 Drawing Sheets

FIG. 21A  REFERECNE CASE (RELATED ART)
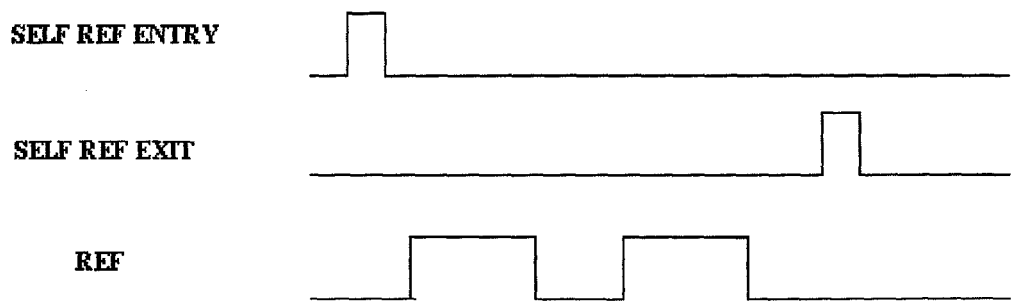
FIG. 21B  REFERECNE CASE (RELATED ART)
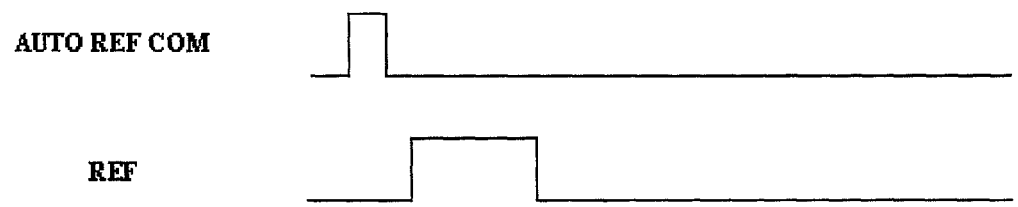

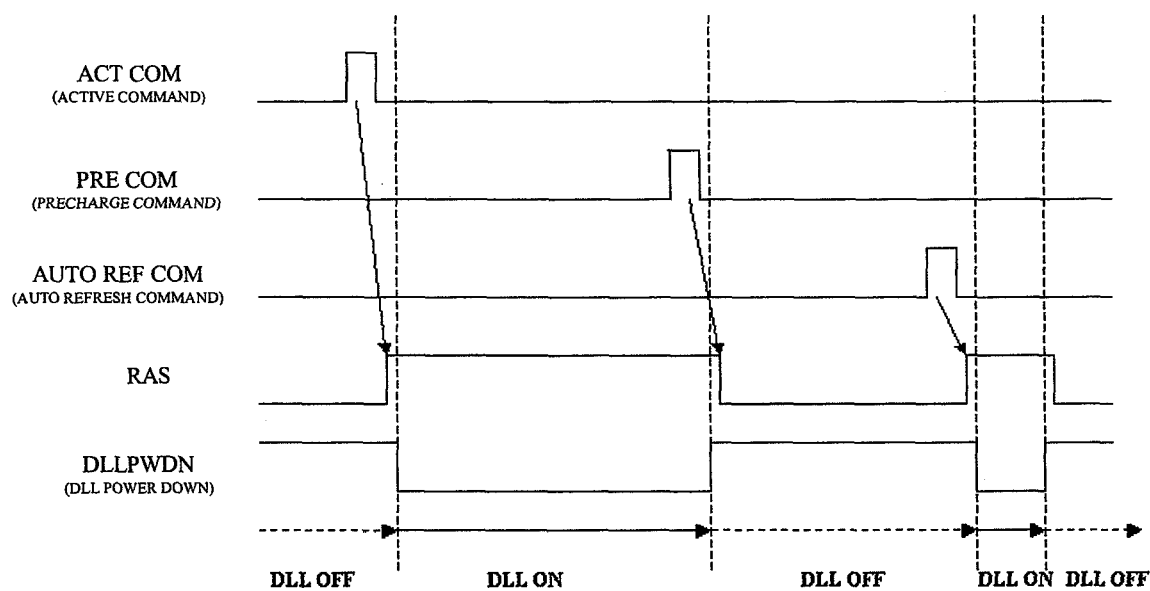
FIG. 22 REFERECNE CASE (RELATED ART)

FIG. 23          RELATED ART
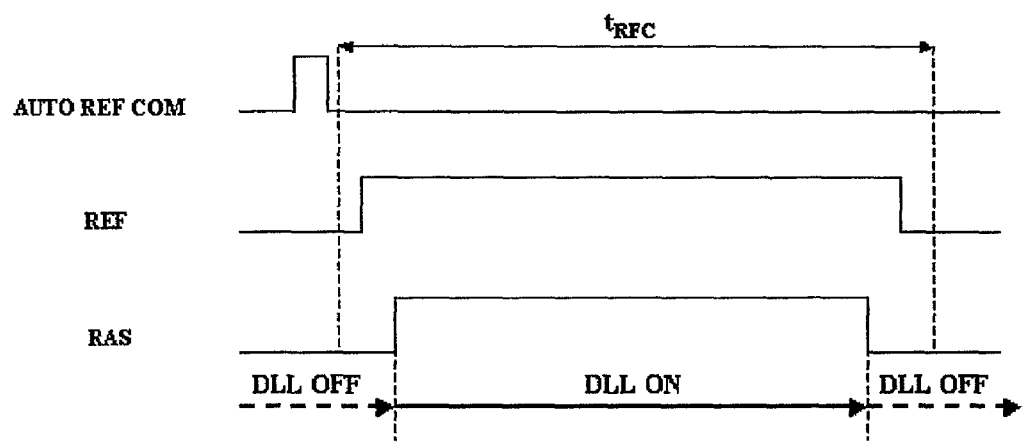

FIG. 25       RELATED ART
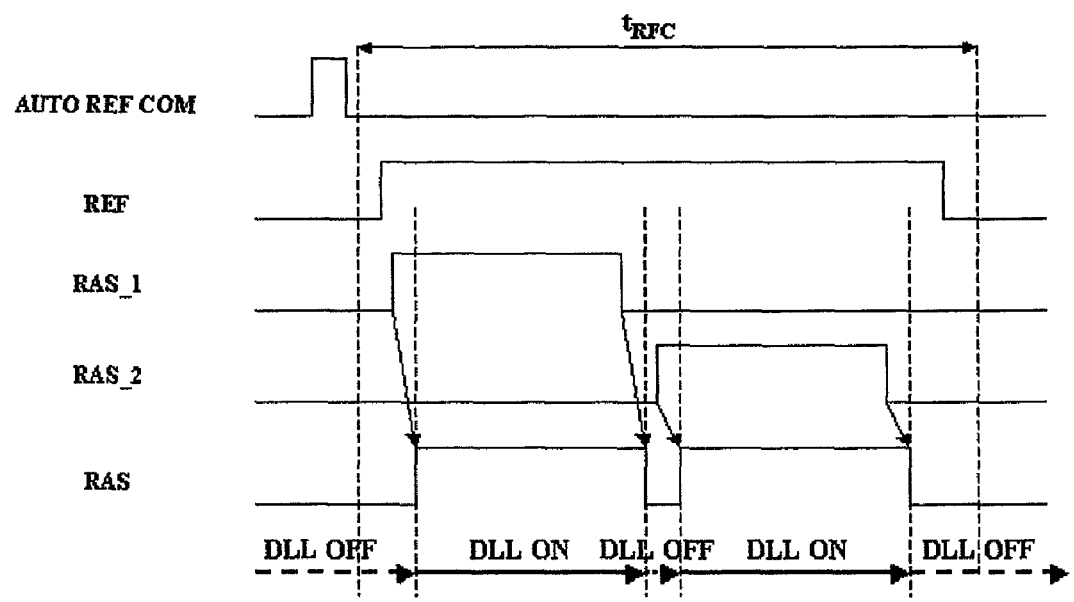

SEMICONDUCTOR DEVICE IN WHICH A MEMORY ARRAY IS REFRESHED BASED ON AN ADDRESS SIGNAL

The present application is a Divisional of U.S. application Ser. No. 11/580,895 filed Oct. 16, 2006, now U.S. Pat. No. 7,545,697, which claims priority from Japanese Patent Application No. 2005-303385 filed on Oct. 18, 2005. The entire disclosures of the aforementioned prior applications are hereby incorporated by reference in their entirety.

FIELD OF THE INVENTION

This invention relates to a semiconductor storage device and, more particularly, to a semiconductor storage device in which a DLL (Delay Locked Loop) is controlled in an auto-refresh interval.

BACKGROUND OF THE INVENTION

A DRAM such as an SDRAM (Synchronous Dynamic Random-Access Memory) stores information by charge retention using a capacitor structure. With charge retention, charge is lost gradually owing to a miniscule leakage current. This necessitates an operation, namely a so-called refresh operation, in which information is read out and the same information written in before charge is lost. Two types of refresh operations, namely auto-refresh and self-refresh, are available for use in an SDRAM. These two types of refresh operations differ in terms of method of control at end of the refresh operation.

With self-refresh, the device itself generates a periodic signal to achieve refresh without relying upon an external clock. In self-refresh, as illustrated in FIG. 21A, if a self-refresh entry signal (SELF REF ENTRY) is input externally, refresh is performed by generating a refresh signal (REF) at a certain fixed period. Refresh of sequential addresses is repeated until a self-refresh exit signal (SELF REF EXIT) arrives from outside.

With auto-refresh, on the other hand, refresh of word lines necessary for a single refresh starts in response to receipt of an external refresh command and refresh is terminated automatically. According to auto-refresh, as illustrated in FIG. 21B, auto-refresh is performed only in an auto-refresh period of time (tRFC in FIG. 23) merely in response to entry of an auto-refresh command (AUTO REF COM) from the outside, and auto-refresh ends automatically.

An SDRAM has a DLL circuit for aligning the phases of a system clock (external clock), which is input externally, and an internal clock, and the DLL is allowed to continue operating when the device is active and also in the auto-refresh period. Although the DLL circuit is a circuit for synchronizing the output data and the external clock, the SDRAM does not output data and does not require a DLL operation in the standby state. It is preferred, therefore, that the DLL circuit be powered down in order to reduce consumption of current. However, if the standby state lasts for too long, there is an increase in jitter owing to phase mismatch between the external and internal clocks ascribable to a change in ambient temperature, etc. Accordingly, it is arranged to prevent an increase in jitter by causing the DLL circuit to operate at the time of auto-refresh by utilizing an auto-refresh command that always arrives at a prescribed cycle, e.g., every 7.8 µs. Further, since a row-active signal RAS (see FIG. 22) becomes active both when the device is active and in the auto-refresh period, it is arranged to cause the DLL circuit to operate at the time of auto-refresh by using the row-active signal RAS.

More specifically, in order to cause the DLL to operate when the device is active and at the time of auto-refresh in the DLL circuit, the row-active signal RAS is utilized as the DLL operation control signal because the nature of the signal RAS is convenient for this purpose. FIG. 22 illustrates the operation of the row-active signal RAS depending upon the status of an SDRAM. Here ACT COM represents an externally applied active command, PRE COM an externally applied precharge command, and AUTO REF COM an externally applied auto-refresh command. The signal RAS in a case where these commands arrive attains the high logic level in active and refresh intervals and the low logic level in a precharge standby state. It is so arranged that when the signal RAS is at the high level, the DLL is caused to operate (DLL ON) by a signal DLL Power Down (DLLPWDN).

If with an increase in the storage capacity of SDRAMs there is an increase in the number of word lines that are refreshed once in the auto-refresh interval, then there will be an increase in peak consumed current. In order to disperse peak current, therefore, it is necessary to stagger or disperse refresh at every specific address or bank. When this is done, the time required for the refresh operation lengthens and hence there is an increase in the auto-refresh interval, which is decided by the JEDEC (Joint Electron Device Engineering Council). For example, the refresh interval lengthens with an increase in storage capacity in the following manner: 75 ns at 256 MB, 105 ns at 512 MB, 127.5 ns at 1 GB, 195 ns at 2 GB, and 327.5 ns at 4 GB.

Conventional control of a DLL at the time of auto-refresh using the signal RAS will now be described in detail. FIG. 23 is a timing chart illustrating a first example of operation of a DLL at the time of refresh according to the related art. Here refresh is performed one time. AUTO REF COM is an externally applied active command. A signal REF is a signal produced within the SDRAM in response to receipt of the auto-refresh command signal AUTO REF COM. At the high level, the signal indicates the refresh interval and the length of the refresh interval is set by a timer so as to fall within tRFC. A signal RAS is a row-active signal and is set in such a manner that the high-level interval of the signal RAS will fall within the high-level interval of the signal REF at refresh time. The interval over which refresh is actually being performed is when the signal RAS is at the high level.

FIG. 24 is a timing chart illustrating a second example of operation of a DLL at the time of refresh according to the related art. Here refresh is performed while being staggered based upon a difference in address. In order to perform refresh in staggered fashion according to a difference in address, use is made of two row-active signals RAS_1 and RAS_2. Here the "i" of signal RAS_i indicates a bank address. The row-active signal RAS is obtained by taking the logical sum of the signals RAS_i the number of which is equivalent to the number of banks (i takes on values of 1 and 2 in FIG. 24).

FIG. 25 is a timing chart illustrating a third example of operation of a DLL at the time of refresh according to the related art. Here refresh is performed while being split based upon a difference in address. In order to split refresh into two refresh segments according to a difference in address, the signal RAS is output while dividing the high interval thereof into two portions (signals RAS_1 and RAS_2).

SUMMARY OF THE DISCLOSURE

The minimum time required for a single refresh in an SDRAM has been decided to a certain degree. Accordingly, in cases where refresh is performed while being staggered or split as illustrated in FIGS. 24 and 25, a long tRFC is required.

Further, although the ON intervals of DLL in FIGS. 23, 24 and 25 are when the signal RAS is at the high level, the DLL is ON over most of the tRFC interval in each case. In other words, with such methods of controlling the operation of the DLL at the time of auto-refresh, the operating time of the DLL lengthens as the tRFC lengthens in an SDRAM of enlarged capacity and hence there is the danger that a large amount of current will be consumed by operation of the DLL.

In view of the circumstances set forth above, the Inventor believes that since data is not output during refresh and it is difficult to imagine that jitter will increase that much in the refresh cycle (e.g., 7.8 μs), it is almost meaningless to continue operating the DLL during the course of a lengthened auto-refresh time period. The Inventor has discovered that in order to reduce refresh operating current, it is effective to shorten the operating time of the DLL in the refresh time period. Accordingly, the Inventor has devised a solution of causing a DLL circuit to operate over a limited period of time within the auto-refresh time period by using a signal RAS that controls divided or split refresh.

According to a first aspect of the present invention, there is provided a semiconductor storage device wherein an address signal for performing refresh while temporally splitting refresh becomes active N times (where N is an integer of at least 2) in a single refresh time period to thereby refresh a memory array successively. The semiconductor storage device comprises: a DLL circuit that aligns phase of an internal clock signal with that of an external clock signal that is externally supplied; and a DLL control circuit that exercises control so as to halt operation of the DLL circuit in an interval in which the address signal becomes active one or more times and not more than N−1 times, this interval being included in an interval in which the address signal becomes active N times.

According to a second aspect of the present invention, there is provided a semiconductor storage device wherein a memory array is refreshed successively in a refresh time period that follows an auto-refresh command. The semiconductor storage device comprises: a DLL circuit that aligns phase of an internal clock signal with that of an external clock signal externally supplied; and a DLL control circuit that exercises control so as to halt operation of the DLL circuit in one or more and not more than M−1 (where M is an integer of at least 2) refresh time periods included in M refresh time periods.

The meritorious effects of the present invention are summarized as follows.

In accordance with the present invention, operating current at the time of auto-refresh in a DLL circuit can be reduced and consumed current can be reduced. The reason for this is that operation of the DLL circuit is limited to only a portion of the refresh time period.

BRIEF DESCRIPTIONS OF THE DRAWINGS

FIGS. 21A and 21B are timing charts of refresh operation;

FIG. 22 is a timing chart of a signal RAS and signal DLL-PWDN corresponding to various commands;

FIG. 23 is a timing chart illustrating a first example of operation of a DLL at the time of auto-refresh according to the related art;

FIG. 25 is a timing chart illustrating a third example of operation of a DLL at the time of auto-refresh according to the related art.

PREFERRED EMBODIMENTS OF THE INVENTION

Figure 1:
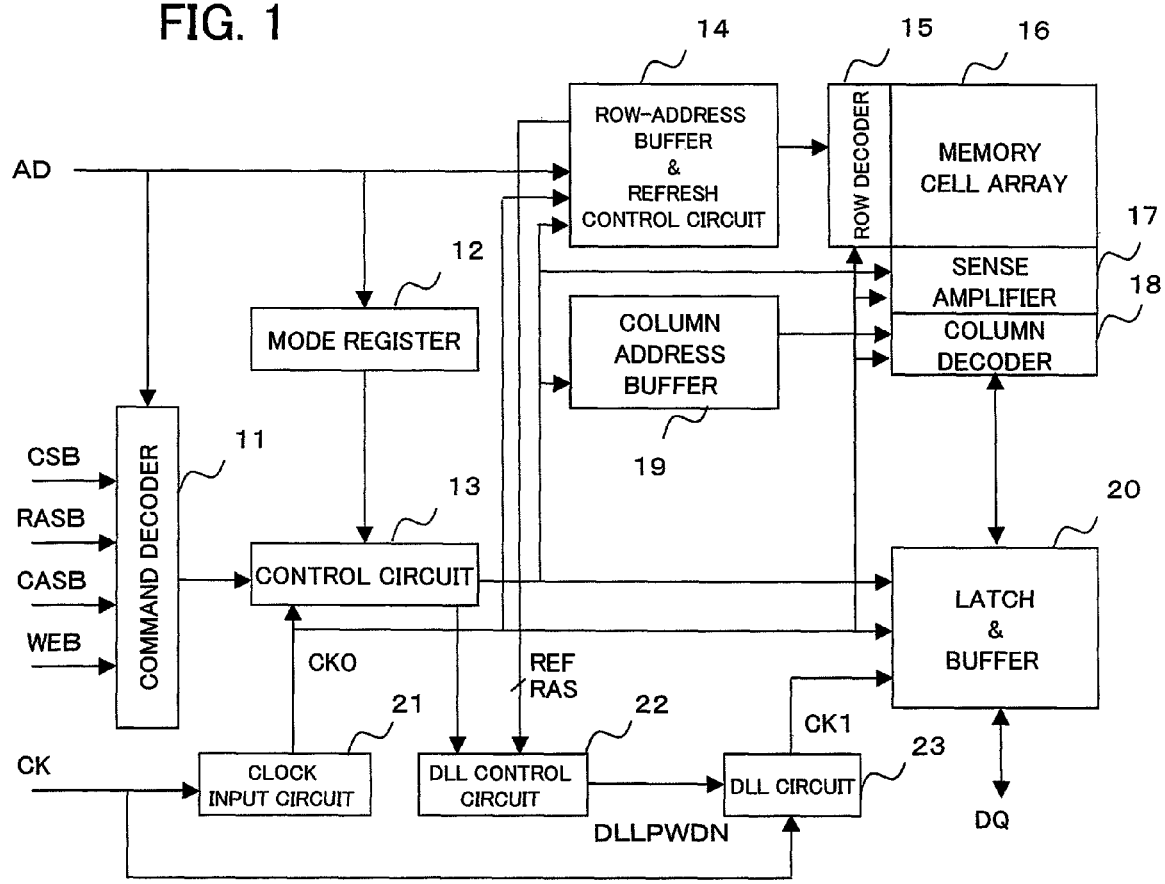
FIG. 1 is a block diagram illustrating the structure of a semiconductor storage device according a first embodiment of the present invention.

A semiconductor storage device according to an embodiment of the present invention is such that a memory array is refreshed successively in response to an address signal, which is for performing refresh while splitting refresh temporally, becoming active N times (where N is an integer equal to or greater than 2) in a single refresh time period. The device includes a DLL circuit that aligns phase of an internal clock signal with that of an external clock signal that is externally supplied; and a DLL control circuit that exercises control in such a manner that operation of the DLL circuit is halted in an interval in which the address signal becomes active one or more times and N−1 times or fewer, this interval being included in an interval in which the address signal becomes active N times. The DLL control circuit has a counter circuit that counts the address signal for performing refresh while splitting refresh temporally, and a decoder circuit that decodes the value of the count recorded by the counter circuit.

Control is exercised in such a manner that the DLL circuit ceases operating during the time that the decoder circuit is decoding a prescribed range of count values. The counter circuit is activated in the refresh time period and is reset outside of the refresh time period. Thus, the DLL control circuit limits operation of the DLL circuit to only a portion of the auto-refresh time period by utilizing a signal for performing refresh while splitting refresh.

A semiconductor storage device according to an embodiment of the present invention is such that a memory array is refreshed successively in a refresh time period that follows an auto-refresh command. The device includes a DLL circuit that aligns phase of an internal clock signal with that of an external clock signal that is externally supplied; and a DLL control circuit that exercises control in such a manner that operation of the DLL circuit is halted in one or more and M−1 or fewer (where M is an integer equal to or greater than 2) refresh time periods included in M refresh time periods. The DLL control circuit has a counter circuit that counts a signal indicative of the auto-refresh-command, and a decoder circuit that decodes the value of the count recorded by the counter circuit. Control is exercised in such a manner that the DLL circuit ceases operating during the time that the decoder circuit is decoding a prescribed range of count values. Thus, the DLL control circuit does not activate the DLL circuit every time in response to receipt of an externally applied auto-refresh command. Rather, the DLL control circuit causes the DLL circuit to operate one time every plurality of auto-refresh commands.

In accordance with the semiconductor storage device according to the embodiments of the present invention, the DLL circuit is activated upon thinning out operating time of the DLL circuit in the refresh time period. Owing to operation of the DLL circuit in this manner, operating current at the time of auto-refresh can be reduced while diminishing jitter in the DLL circuit.

Embodiments of the present invention will now be described in detail with reference to the drawings.

First Embodiment

FIG. 1 is a block diagram illustrating the structure of a semiconductor storage device according to a first embodiment of the present invention. As shown in FIG. 1, the semiconductor storage device is an SDRAM and includes a command decoder 11, a mode register 12, a control circuit 13, a row-address buffer & refresh control circuit 14, a row decoder 15, a memory cell array 16, a sense amplifier 17, a column decoder 18, a column address buffer 19, a latch & buffer 20, a CK input circuit 21, a DLL control circuit 22 and a DLL circuit 23.

The command decoder 11 decodes a chip select signal CSB, a row-address strobe signal RASB, a column address strobe signal CASB, a write-enable signal WEB and an address signal AD and outputs a decoded signal, which is for setting various operating modes in the SDRAM, to the control circuit 13. On the basis of the decoded signal and the address signal AD, which has been loaded by a mode register 12, the control circuit 13 controls the row-address buffer & refresh control circuit 14, sense amplifier 17, column address buffer 19, latch & buffer 20 and DLL control circuit 22 in accordance with various operating modes of the SDRAM.

The column address buffer 19 decodes a column address from the address signal AD loaded via the mode register 12 and control circuit 13 and supplies the address to the column decoder 18. Read/write of data is performed via the sense amplifier 17 with respect to a cell in the memory cell array 16 designated by the row and column addresses. At the time of memory write, write data that enters from a data input/output DQ is written to the cell in the 16 via the latch & buffer 20, column decoder 18 and sense amplifier 17. Further, at memory read, memory data that has been read out of a cell in the memory cell array 16 is output from the data input/output DQ via the sense amplifier 17, column decoder 18 and latch & buffer 20.

The CK input circuit 21 inputs an externally applied input clock CK, generates an internal clock CK0 and supplies the internal clock CK0 as timing information to the control circuit 13, row-address buffer & refresh control circuit 14, row decoder 15, sense amplifier 17, column decoder 18 and latch & buffer 20, etc.

The row-address buffer & refresh control circuit 14 extracts a row address from the address signal AD by control exercised by the control circuit 13, and supplies row address information for read/write to the memory cell array 16 via the row decoder 15. Further, row address information for refresh is supplied to the memory cell array 16 via the row decoder 15. In conformity with the refresh timing, signals REF and RAS, etc., are supplied to the DLL control circuit 22 so as to control operation of the DLL circuit 23. A command signal AUTO REF COM, which is a signal that designates the auto-refresh command, is supplied to the DLL control circuit 22 as necessary. The signal REF corresponds to a refresh signal produced within the row-address buffer & refresh control circuit 14 in response to an externally applied auto-refresh command, and the high level of the REF signal is indicative of the refresh time period. The length of the high interval is set by a timer or the like so as to fall within tRFC, and it is so arranged that the refresh operation is completed within tRFC. Further, the signal RAS corresponds to a word-line hit signal, namely an address signal that makes the row address of a memory cell active.

On the basis of the signals REF and RAS, etc., the DLL control circuit 22 outputs a signal DLLPWDN, which controls operation of the DLL circuit 23, to the DLL circuit 23. The latter inputs the externally applied input clock CK and outputs jitter-suppressed clock signal CK1 to the latch & buffer 20, etc., as timing information. Halting of output of the clock signal CK1 is controlled by the signal DLLPWDN. The latter corresponds to a DLL power-down signal that controls normal operation and power-down operation of the DLL circuit 23.

Next, the details of the semiconductor storage device thus constructed will be described focusing on the structure and timing chart of the DLL control circuit 22 that is for causing the DLL circuit 23 to operate in part of the refresh time period.

Figure 2:
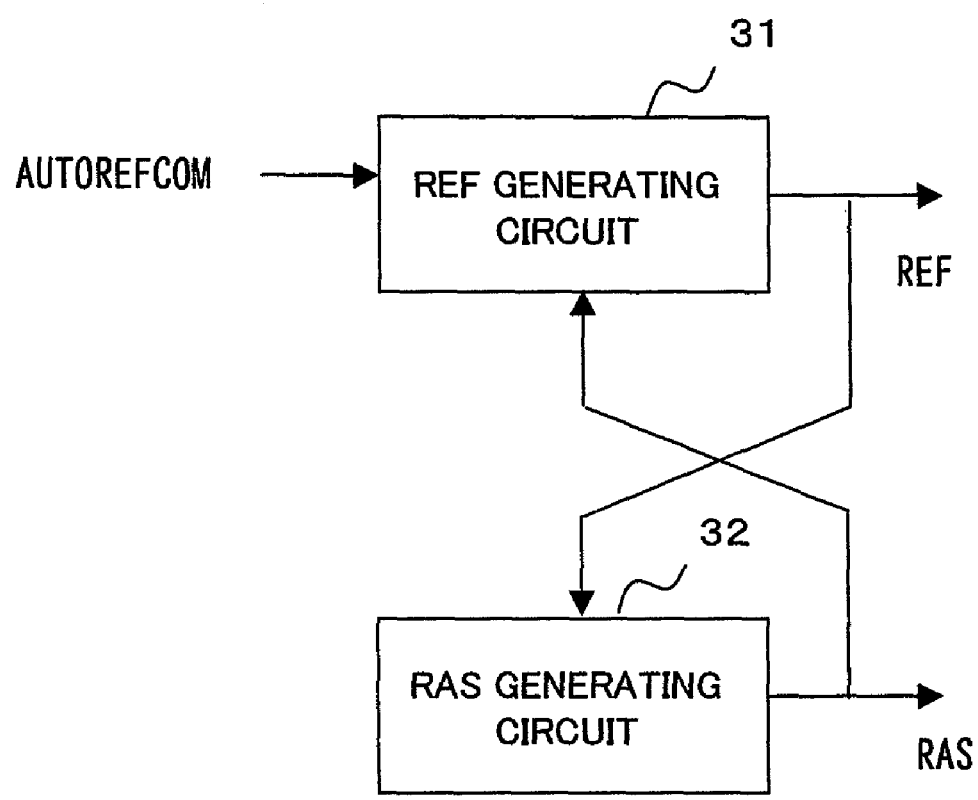
FIG. 2 is a block diagram illustrating a circuit for generating a signal REF and a signal RAS.

FIG. 2 is a block diagram illustrating a circuit that generates the signals REF and RAS. This signal generating circuit is provided within the row-address buffer & refresh control circuit 14. A REF generating circuit 31 outputs the signal REF (changes the level of the signal from low to high) in response to the auto-refresh command signal AUTO REF COM generated by the row-address buffer & refresh control circuit 14. In response to output of the signal REF, a RAS generating circuit 32 outputs the signal RAS (changes the level of the signal from low to high). Further, after the level of the signal RAS is changed from low to high, the RAS generating circuit 32 changes the level of the signal RAS from high to low upon elapse of a prescribed period of time measured as by an internal timer or the like. The RAS generating circuit 32 subsequently changes the level of the signal RAS from low to high again and then from high to low upon elapse of the prescribed period of time. After the RAS generating circuit 32 outputs the high-level signal RAS N times (where N is an integer of at least 2), the REF generating circuit 31 changes the signal REF from the high to the low level.

Figure 3:
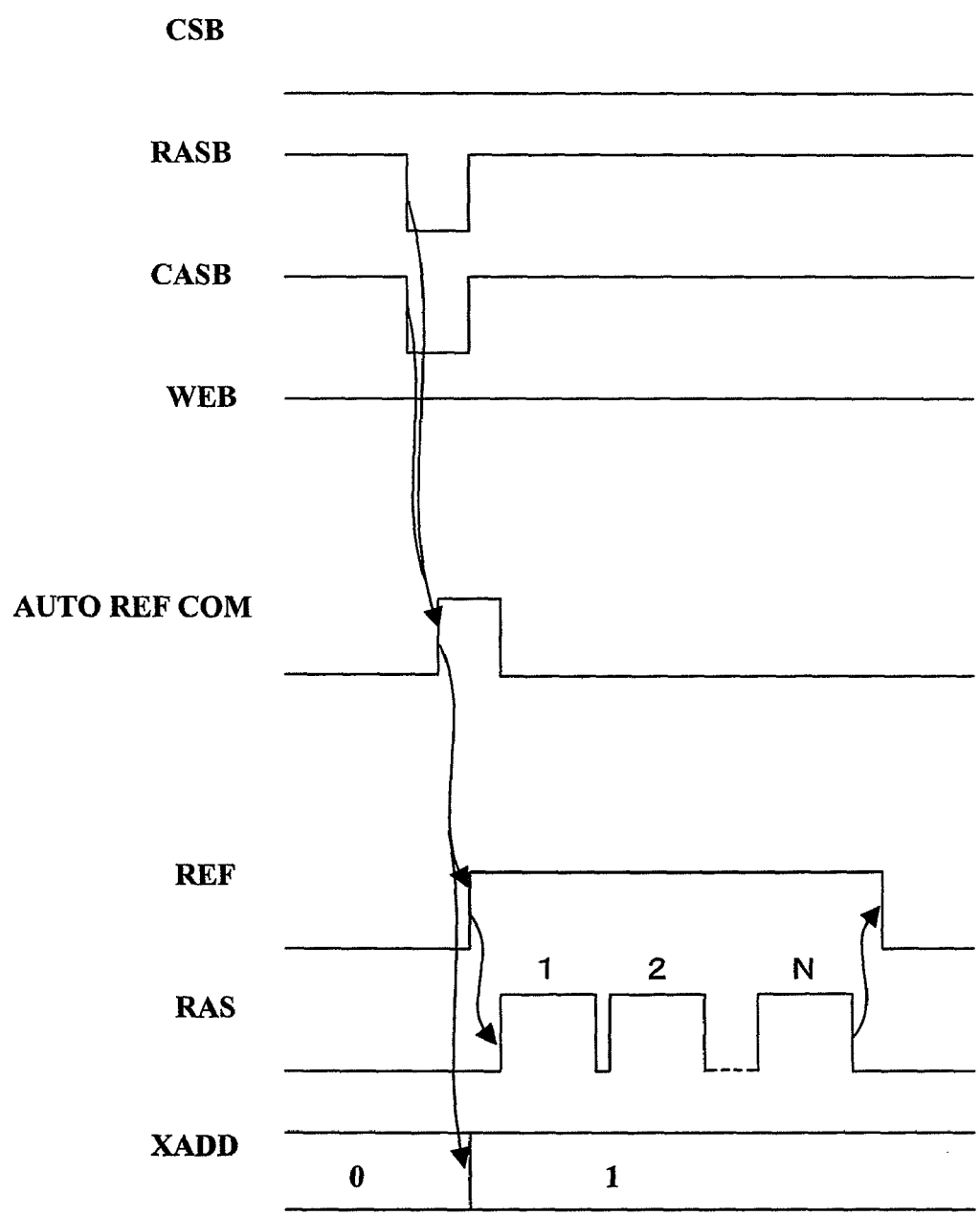
FIG. 3 is a timing chart illustrating the timings at which the signal REF and signal RAS are generated.

FIG. 3 is a timing chart illustrating the timings at which the signals REF and RAS are generated. When the chip select signal CSB is at the low level, the write-enable signal WEB is at the high level and the row-address strobe signal RASB and column address strobe signal CASB fall to the low level, the auto-refresh command signal AUTO REF COM is generated in the row-address buffer & refresh control circuit 14. The latter refreshes the memory cell array 16 based upon the auto-refresh command signal AUTO REF COM. When the auto-refresh command signal AUTO REF COM has attained the high level, the signal REF rises and, after a slight delay, so does the signal RAS. At this time, as described later in a sixth embodiment, a signal XADD is incremented. Further, after the signal RAS has attained the high level N times, the signal REF reverts from the high to the low level, as mentioned above.

Figure 4:
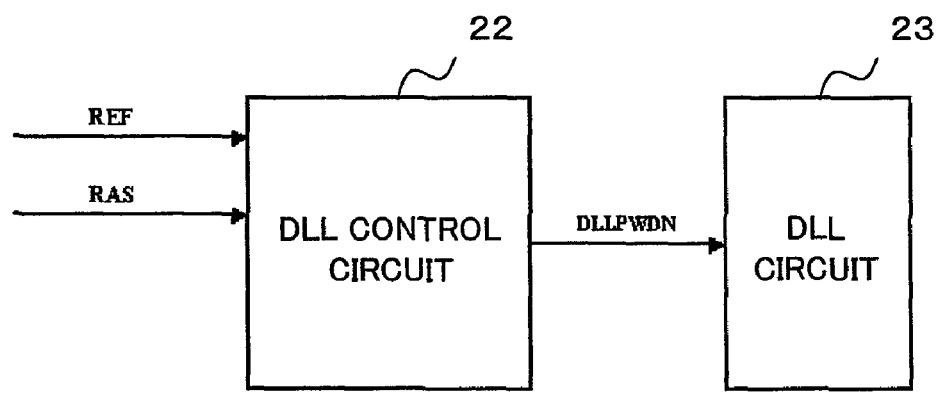
FIG. 4 is a block diagram illustrating a DLL control circuit and a DLL circuit.

The signals REF and RAS thus generated are input to the DLL control circuit 22, as illustrated in FIG. 4, and the DLL control circuit 22 outputs the signal DLLPWDN to the DLL circuit 23 based upon the signal REF and RAS.

Figure 5:
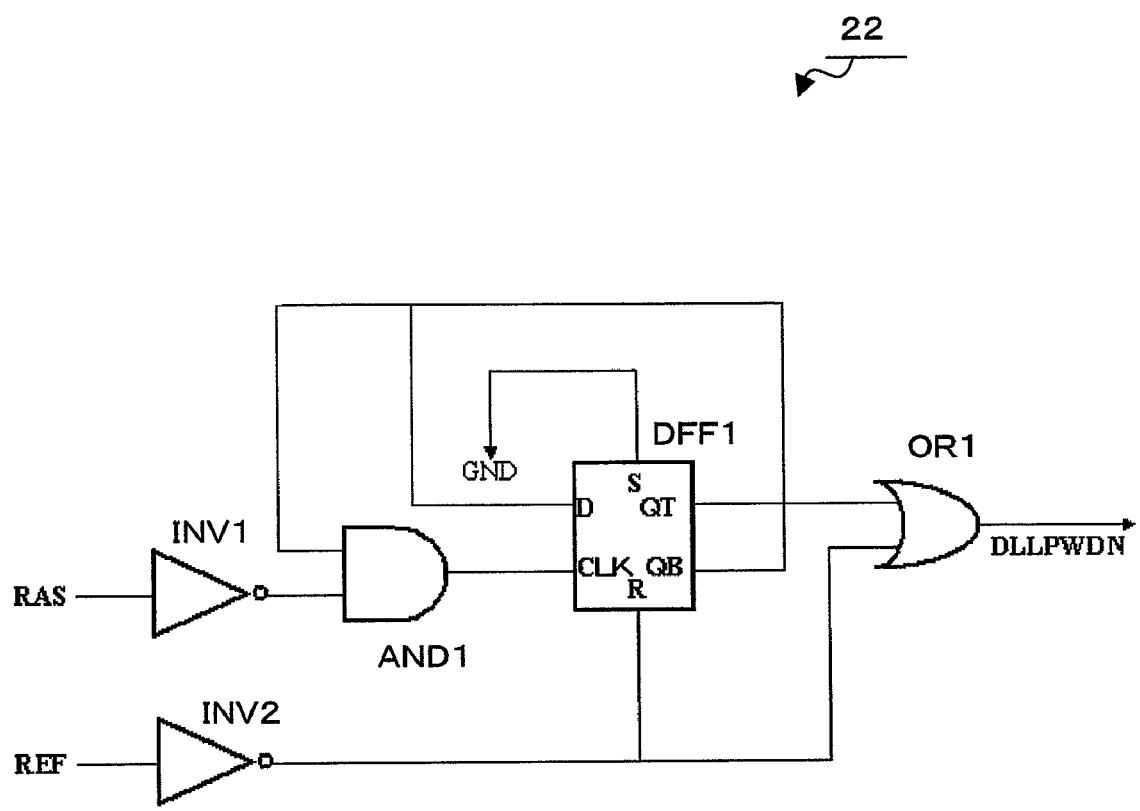
FIG. 5 is a circuit diagram illustrating a DLL control circuit according to the first embodiment.

FIG. 5 is a circuit diagram illustrating the DLL control circuit 22 according to the first embodiment. As shown in FIG. 5, the DLL control circuit 22 includes inverter circuits INV1, INV2, a logical AND gate AND1, a logical OR gate OR1, and a D-type flip-flop DFF1. The inverter INV1 logically inverts the input signal RAS and outputs the inverted signal to one input terminal of the logical AND gate AND1. The inverter INV2 logically inverts the input signal REF and outputs the inverted signal to a reset terminal R of the D-type flip-flop DFF1 and to one input terminal of the OR gate OR1. The other input terminal of the AND gate AND1, a data input terminal D of the D-type flip-flop DFF1 and a data-inverting output terminal QB of the D-type flip-flop DFF1 are connected commonly, and the output terminal of the AND gate AND1 is connected to a clock input terminal CLK of the D-type flip-flop DFF1. A data output terminal QT of the D-type flip-flop DFF1 is connected to the other input terminal of the OR gate OR1, and the signal DLLPWDN is output from the output terminal of the OR gate OR1.

Figure 6:
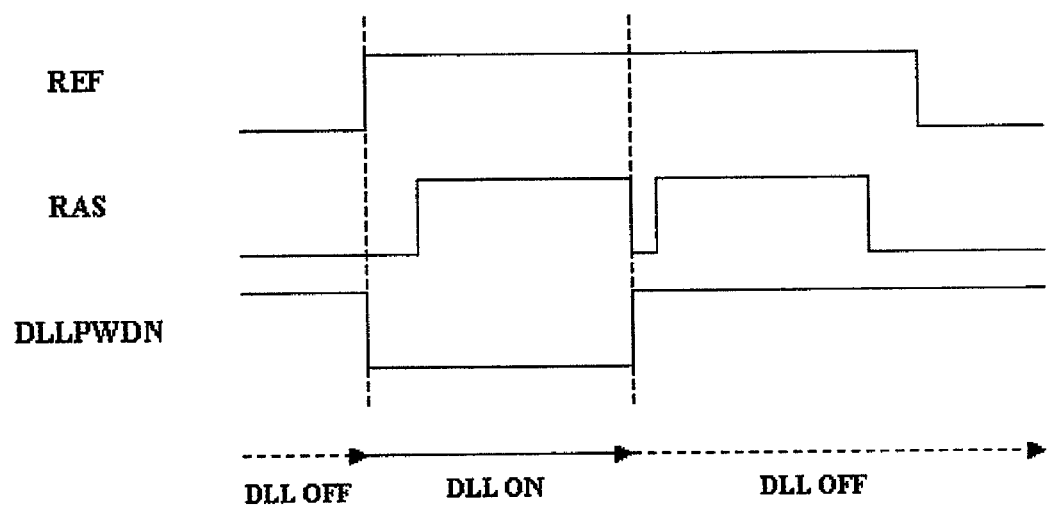
FIG. 6 is a timing chart of the DLL control circuit according to the first embodiment.

FIG. 6 is a timing chart of the DLL control circuit 22 depicted in FIG. 5. In FIG. 6, the signal RAS indicates that a row address is active when this signal is at the "H" level. In order to perform refresh while dividing the refresh time period into two intervals, the signal RAS has two high-level intervals, namely first- and second-half high-level intervals. The DLL circuit 23 is powered down in the high-level interval of the signal DLLPWDN and operates in the low-level interval. The signal DLLPWDN, which is produced by the DLL control circuit 22 from the signals REF and RAS, assumes the low level from the rising edge of the signal REF to the first falling edge of the signal RAS. In the case of the first embodiment, the DLL circuit 23 is controlled so as to operate in the first half of the auto-refresh time period and is placed in the powered-down state in the second half of the auto-refresh time period. Consequently, since the DLL circuit 23 only operates in half of the auto-refresh time period, current consumption is halved.

Second Embodiment

Figure 7:
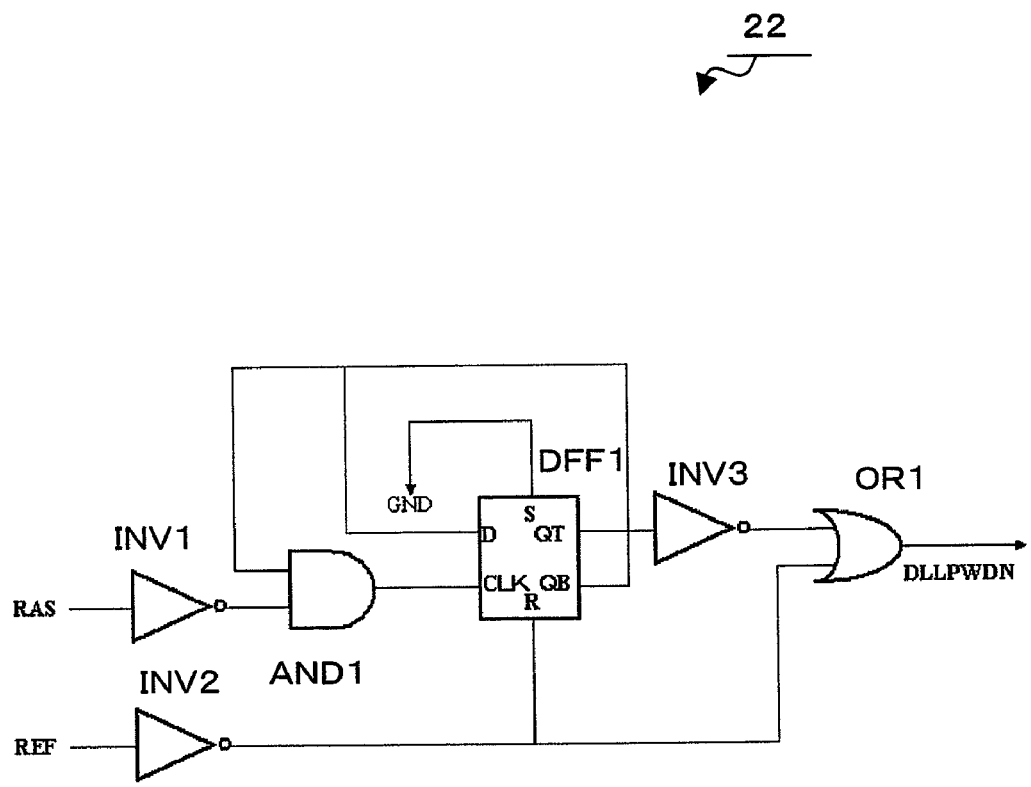
FIG. 7 is a circuit diagram illustrating a DLL control circuit according to a second embodiment of the present invention.

FIG. 7 is a circuit diagram illustrating the DLL control circuit 22 according to a second embodiment of the present invention. Components identical with those shown in FIG. 5 are designated by like reference characters and need not be described again. The DLL control circuit 22 shown in FIG. 7 includes an inverter INV3 inserted between the data output terminal QT of the D-type flip-flop DFF1 in FIG. 5 and the other input terminal of the OR gate OR1.

Figure 8:
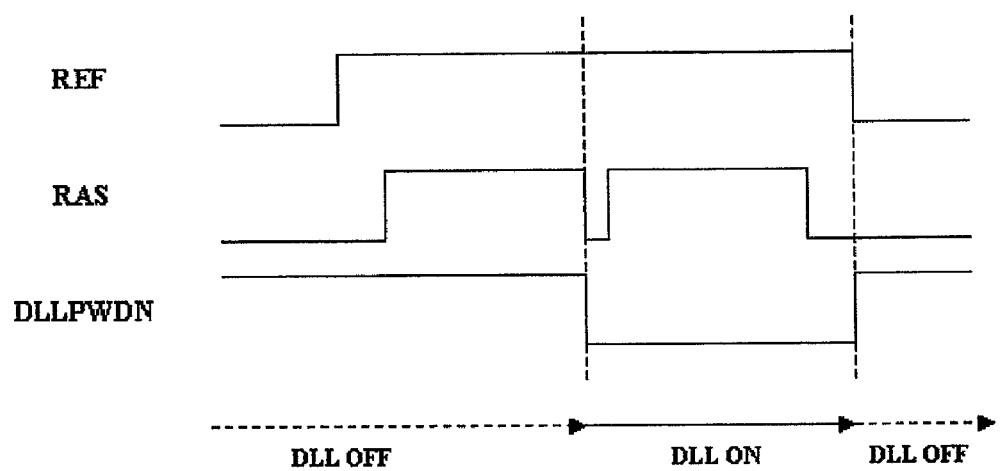
FIG. 8 is a timing chart of the DLL control circuit according to the second embodiment.

FIG. 8 is a timing chart of the DLL control circuit 22 depicted in FIG. 7. In FIG. 8, the signal DLLPWDN controlled by the signals REF and RAS a low-level interval from the first falling edge of the signal RAS to the falling edge of the signal REF. In the first embodiment, the arrangement is such that the DLL circuit is caused to operate in the first half of the auto-refresh time period. In the second embodiment, however, it is so arranged that the DLL circuit is caused to operate in the latter half of the auto-refresh time period.

Third Embodiment

Figure 9:
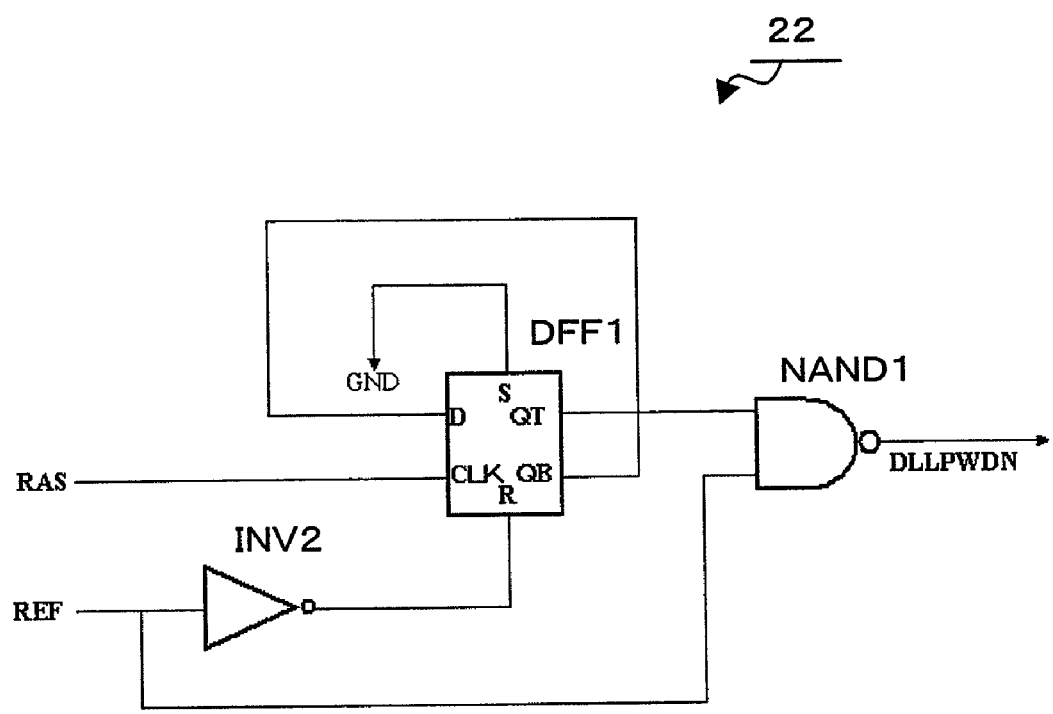
FIG. 9 is a circuit diagram illustrating a DLL control circuit according to a third embodiment of the present invention.

FIG. 9 is a circuit diagram illustrating the DLL control circuit 22 according to a third embodiment of the present invention. Components identical with those shown in FIG. 5 are designated by like reference characters and need not be described again. The DLL control circuit shown in FIG. 9 is devoid of the AND gate AND1 in FIG. 5 and has the signal RAS input directly to the clock input terminal input CLK of the D-type flip-flop DFF1. Further, the OR gate OR1 of FIG. 5 is eliminated and the circuit is provided with a NAND gate NAND1. The signal REF is input to one input terminal of the NAND gate NAND1, the data output terminal QT is connected to the other input terminal, and the output terminal of the NAND gate NAND1 outputs the signal DLLPWDN to the DLL circuit 23.

Figure 10:
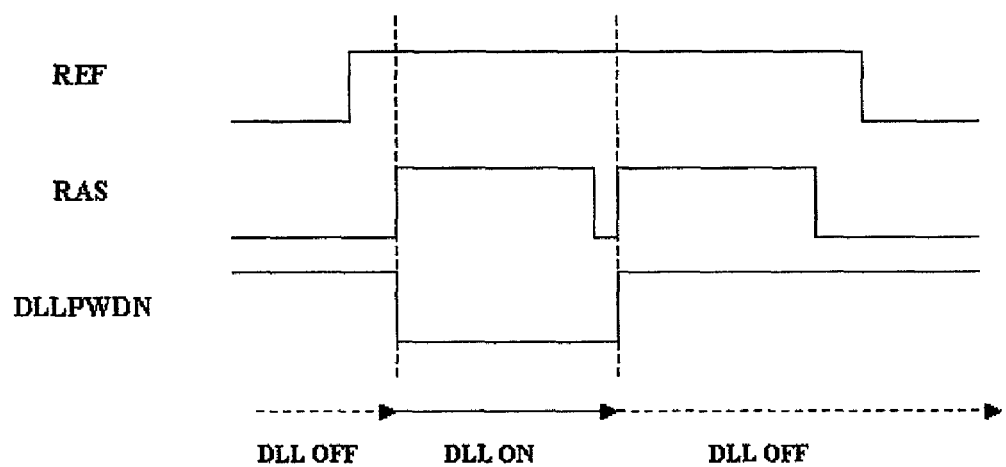
FIG. 10 is a timing chart of the DLL control circuit according to the third embodiment.

FIG. 10 is a timing chart of the DLL control circuit illustrated in FIG. 9. As shown in FIG. 10, the signal DLLPWDN controlled by the signals REF and RAS assumes the low level from the first rising edge of the signal RAS to the second rising edge of the signal RAS. That is, in the third embodiment, the arrangement is such that the DLL circuit is made to operate in the first half of the auto-refresh time period in a manner similar to that of the first embodiment.

Fourth Embodiment

Figure 11:
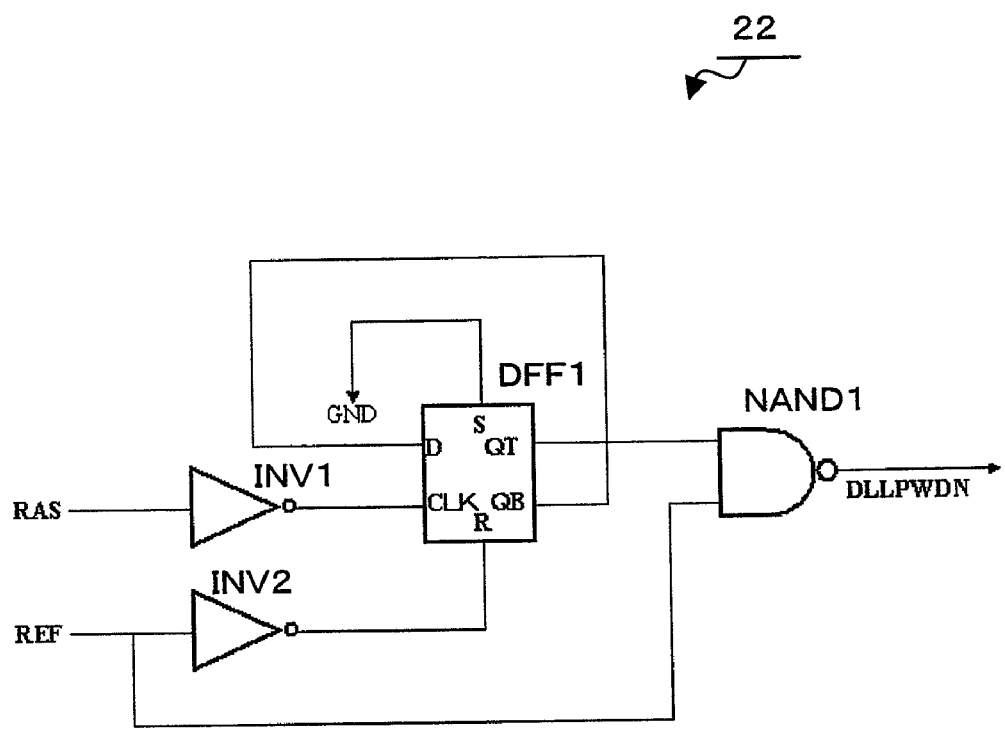
FIG. 11 is a circuit diagram illustrating a DLL control circuit according to a fourth embodiment of the present invention.

FIG. 11 is a circuit diagram illustrating the DLL control circuit 22 according to a fourth embodiment of the present invention. Components identical with those shown in FIG. 9 are designated by like reference characters and need not be described again. The DLL control circuit shown in FIG. 11 has the inverter INV1 whose output terminal is connected to the input clock signal CLK of the D-type flip-flop DFF1 in FIG. 9 and to the input terminal of which the signal RAS is supplied.

Figure 12:
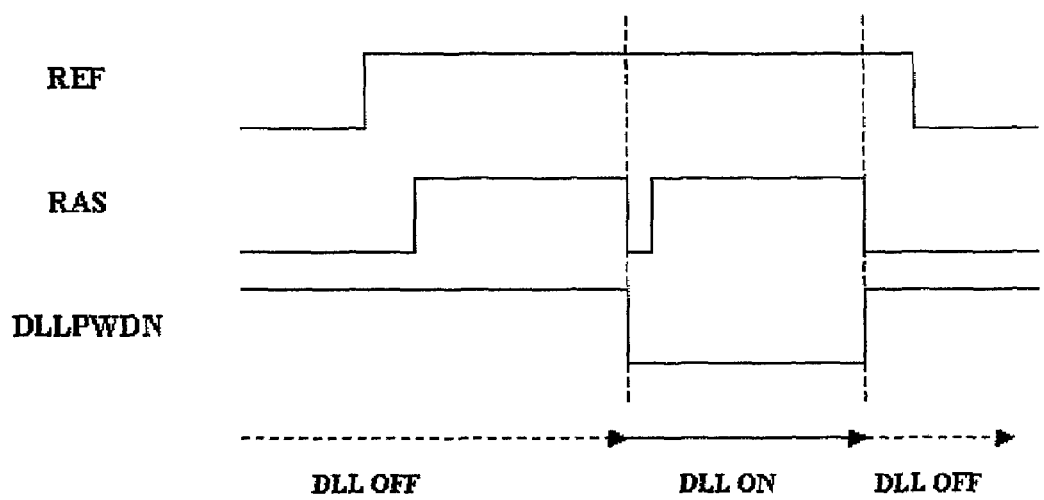
FIG. 12 is a timing chart of the DLL control circuit according to the fourth embodiment.

FIG. 12 is a timing chart of the DLL control circuit illustrated in FIG. 11. As shown in FIG. 12, the signal DLLPWDN controlled by the signals REF and RAS has a low-level interval from the first falling edge of the signal RAS to the second falling edge of the signal RAS. That is, in the fourth embodiment, the arrangement is such that the DLL circuit is made to operate in the latter half of the auto-refresh time period in a manner similar to that of the second embodiment.

Fifth Embodiment

Figure 13:
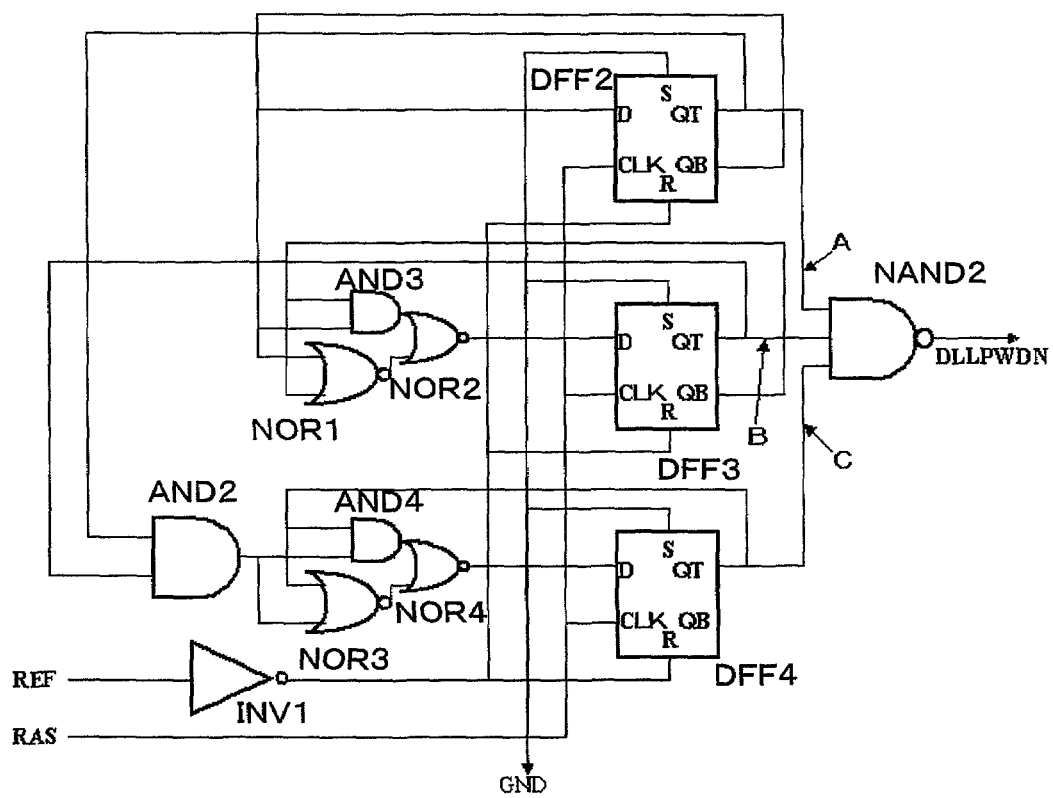
FIG. 13 is a circuit diagram illustrating a DLL control circuit according to a fifth embodiment of the present invention.

FIG. 13 is a circuit diagram illustrating the DLL control circuit 22 according to a fifth embodiment of the present invention. As shown in FIG. 13, the DLL control circuit 22 includes D-type flip-flops DFF2, DFF3 and DFF4, AND gates AND2, AND3 and AND4, a NAND gate NAND2, NOR gates NOR1, NOR2, NOR3 and NOR4, and inverter INV1.

The inverter INV1 inverts the input signal REF and outputs the inverted signal to reset terminals R of respective ones of the D-type flip-flops DFF2, DFF3 and DFF4. The signal RAS is supplied to the clock terminals CLK of respective ones of the D-type flip-flops DFF2, DFF3 and DFF4.

Output terminal QT of the D-type flip-flop DFF2, which outputs a signal A, is connected to one input terminal of the NAND gate NAND2 and to one input terminal of the AND gate AND2. Inverting output terminal QB of the D-type flip-flop DFF2 is input to data input terminal D of the D-type flip-flop DFF2, one input terminal of the AND gate AND3 and one input terminal of the NOR gate NOR1.

Output terminal QT of the D-type flip-flop DFF3, which outputs a signal B, is connected to the other input terminal of the NAND gate NAND2 and to the other input terminal of the AND gate AND2. Inverting output terminal QB of the D-type flip-flop DFF3 is input to the other input terminal of the AND gate AND3 and to the other input terminal of the NOR gate NOR1. The NOR gate NOR2 has one input terminal thereof connected to the output terminal of the AND gate AND3, has the other input terminal thereof connected to the output terminal of the NOR gate NOR1, and has the output terminal thereof connected to the data input terminal D of the D-type flip-flop DFF3.

Output terminal QT of the D-type flip-flop DFF4, which outputs a signal C, is connected to a further input terminal of the NAND gate NAND2, to one input terminal of the AND gate AND4, and to one input terminal of the NOR gate NOR3. The output terminal of the AND gate AND2 is connected to the other input terminal of the AND gate AND4 and to the other input terminal of the NOR gate NOR3. The NOR gate NOR4 has one input terminal thereof connected to the output terminal of the AND gate AND4, has the other input terminal thereof connected to the output terminal of the NOR gate NOR3, and has the output terminal thereof connected to the data input terminal D of the D-type flip-flop DFF4. Further, the signal DLLPWDN is output from the output terminal of the NAND gate NAND2.

The DLL control circuit thus constructed is such that the D-type flip-flops DFF2, DFF3 and DFF4 constitute counters whereby the rising edges of the signal RAS are counted. The results of the counts are decoded by the NAND gate NAND2, which corresponds to a decoder, whereby the signal DLLPWDN is produced.

Figure 14:
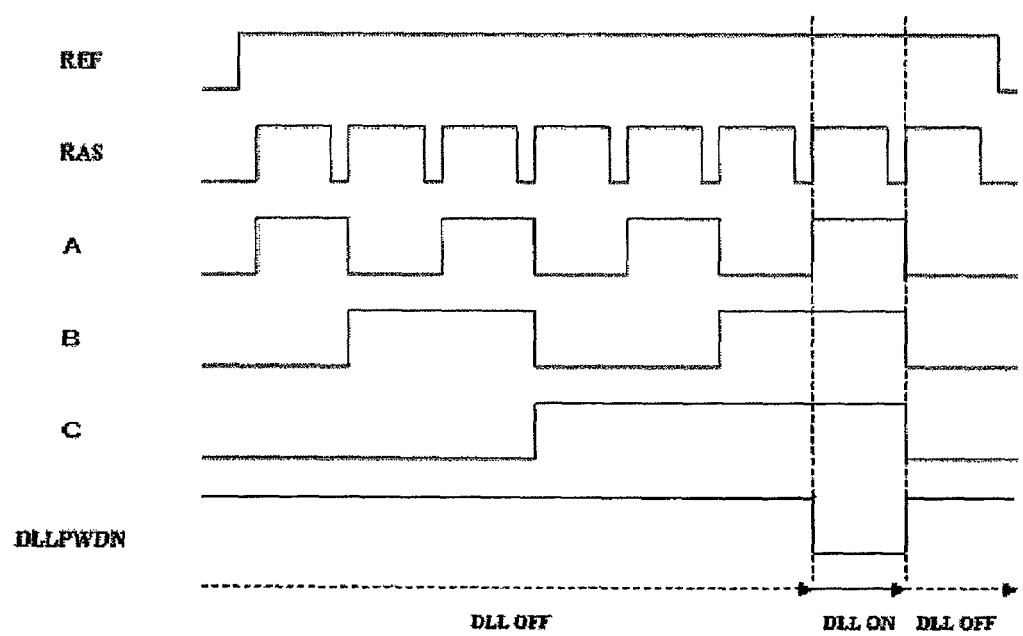
FIG. 14 is a timing chart of the DLL control circuit according to the fifth embodiment.

FIG. 14 is a timing chart of the DLL control circuit illustrated in FIG. 13. As shown in FIG. 14, the values of the counts that are output from the counter circuits comprising the D-type flip-flops DFF2, DFF3 and DFF4, to which the signal REF is applied as a reset signal and the signal RAS is applied as a clock, are indicated by signals A, B and C, respectively. The DLL control circuit of FIG. 13 is such that by taking the NAND among the signals A, B and C, the signal DLLPWDN falls to the low level in a case where the signals A, B and C are all at the high level. That is, refresh in the auto-refresh time period is split into eight refresh segments and the DLL circuit is caused to operate at the time of the seventh refresh. Current consumption is reduced to approximately 1/8 by such operation.

The first to fourth embodiments have been described with regard to a case where the signal RAS is divided into two high-level intervals within the auto-refresh period, i.e., a case where refresh is performed while being divided into two refresh segments. By contrast, in the fifth embodiment, refresh is performed while being divided into three or more segments. In this case also it is possible to exercise control so as to output the signal DLLPWDN in any refresh time period. A modification of the DLL control circuit of the fifth embodiment would be a circuit arrangement that increases the counter values in conformity with an increase in the number times refresh is performed. Further, the manner in which the signals A, B, C, etc., are handled logically would be changed (the structure of the decoder would be changed). By adopting such an arrangement, control can be exercised so as to output the signal DLLPWDN over a prescribed range of counter values.

Sixth Embodiment

Figure 15:
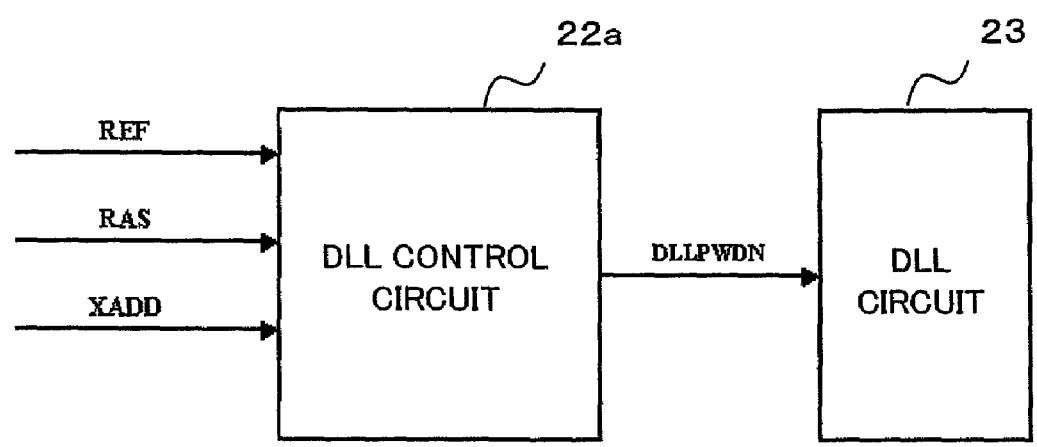
FIG. 15 is a block diagram illustrating a DLL control circuit and a DLL circuit according to a sixth embodiment of the present invention.

FIG. 15 is a block diagram illustrating a DLL control circuit 22a and the DLL circuit 23 according to a sixth embodiment of the present invention. In the first to fifth embodiments, the input signals to the DLL control circuit are two, namely the signal REF and the signal RAS (word-line hit signal). By contrast, the DLL control circuit 22a of the sixth embodiment has a row-address select signal XADD in addition to the other two inputs, and the signal DLLPWDN is output based upon these three signals. Generally, in a case where refresh is performed while being split into segments at the time of auto-refresh, refresh is carried out at every certain address. It should be noted that the row-address select signal XADD is produced within the row-address buffer & refresh control circuit 14 as by a counter that counts the auto-refresh command signal AUTO REF COM, by way of example.

Figure 16:
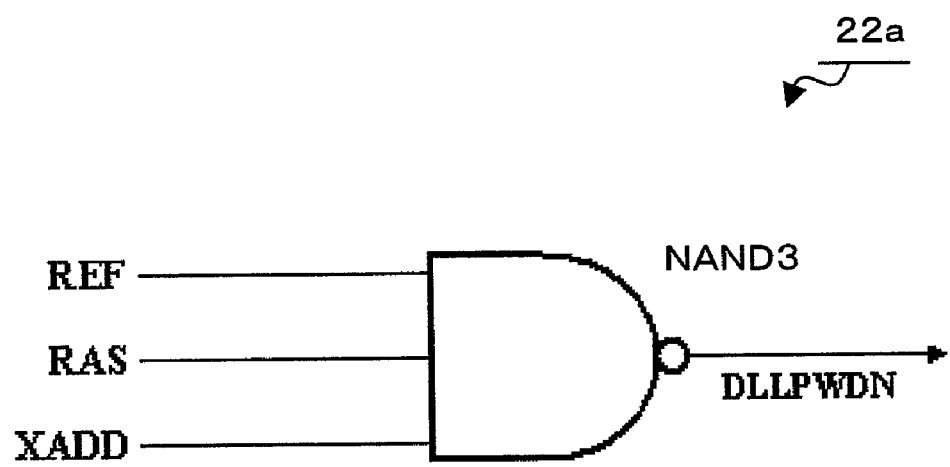
FIG. 16 is a circuit diagram illustrating a DLL control circuit according to the sixth embodiment.

FIG. 16 is a circuit diagram illustrating the DLL control circuit 22a according to the sixth embodiment. The DLL control circuit 22a has a 3-input NAND gate NAND3, receives the signals REF, RAS and the row-address select signal XADD as inputs and outputs the signal DLLPWDN.

Figure 17:
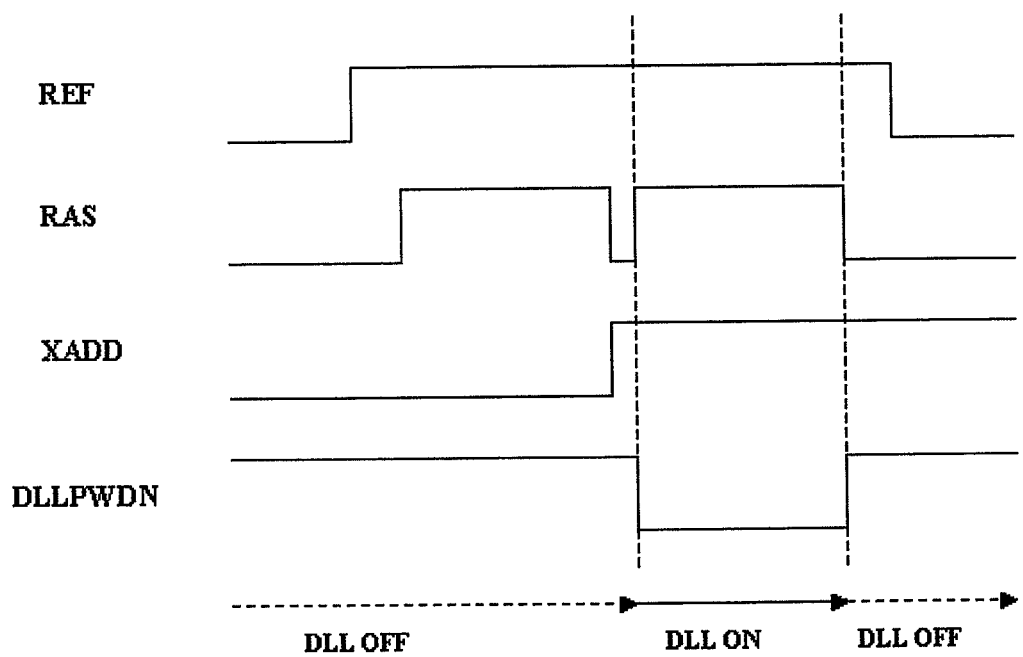
FIG. 17 is a timing chart of the DLL control circuit according to the sixth embodiment.

FIG. 17 is a timing chart of the DLL control circuit 22a illustrated in FIG. 16. As shown in FIG. 17, the signal DLLPWDN, which is controlled by the signals REF, RAS and row-address select signal XADD, falls to the low level when all of these input signals attain the high level. The arrangement is such that since the row-address select signal XADD is selected to be high in the latter half of the refresh time period, the DLL circuit is caused to operate in the latter half of the refresh time period.

The circuit structure of the DLL control circuit according to the sixth embodiment is simple in comparison with that of the first to fifth embodiments owing to use of the row-address select signal XADD. Further, in terms of modifications of the sixth embodiment, since a plurality of address-select signals exist, it is possible to cause the DLL circuit to operate in the first half of the refresh time period by decoding the address-select signals while selectively interchanging them. Furthermore, it is possible to cause the DLL circuit to operate over a prescribed limited interval of the refresh time period by making this conform to an increase in the number times refresh is performed in a manner similar to that of the fifth embodiment.

As modifications of the first to sixth embodiments, it is possible to extend or curtail the ON, OFF intervals of respective ones of the signals DLLPWDN by using a delay circuit. More specifically, it may be so arranged that the timings of the signals REF, RAS, etc. that have been input to the DLL control circuit are adjusted by being delayed within the DLL control circuit to thereby change the timing of the signal DLLPWDN.

Seventh Embodiment

Figure 18:
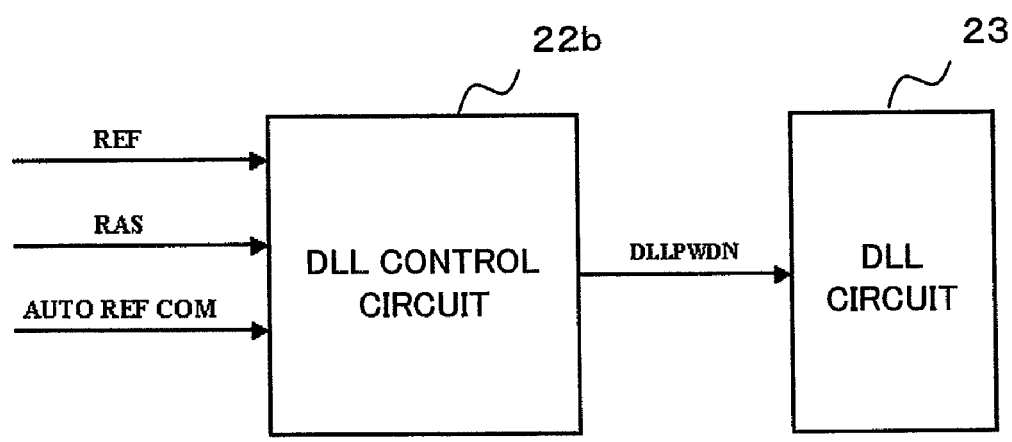
FIG. 18 is a block diagram illustrating a DLL control circuit and a DLL circuit according to a seventh embodiment of the present invention.

FIG. 18 is a block diagram illustrating a DLL control circuit 22b and the DLL circuit 23 according to a seventh embodiment of the present invention. Here the auto-refresh command signal AUTO REF COM is input as a control signal of the DLL control circuit 22b in addition to the signals REF and RAS.

Figure 19:
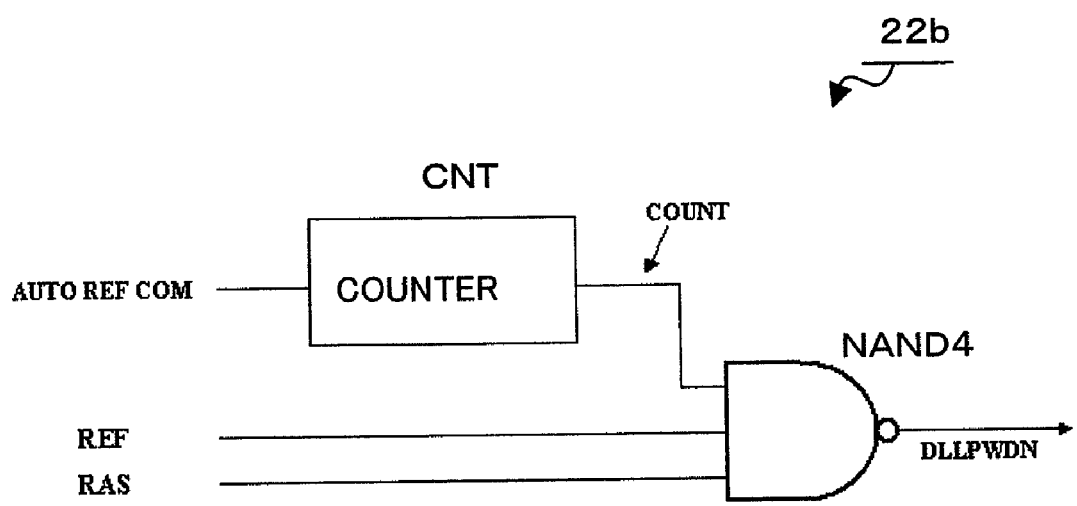
FIG. 19 is a circuit diagram illustrating a DLL control circuit according to the seventh embodiment.

FIG. 19 is a circuit diagram of the DLL control circuit 22b. Here a counter circuit CNT is a counter that counts the number of times the auto-refresh command signal AUTO REF COM is input, namely a counter that counts the number of pulses in the auto-refresh command signal AUTO REF COM. The counter circuit CNT counts the number of pulses and outputs a signal COUNT that attains the high level at a rate of once every two pulses counted. A NAND gate NAND4 takes the NAND among the signal COUNT and the signals REF, RAS and outputs the signal DLLPWDN to the DLL circuit 23. By counting the number of times the auto-refresh command is externally applied, the DLL control circuit 22b causes the DLL circuit 23 to operate every plurality of auto-refresh commands. It should be noted that the counter circuit CNT may use an address counter that counts the number of addresses that are to be refreshed.

Figure 20:
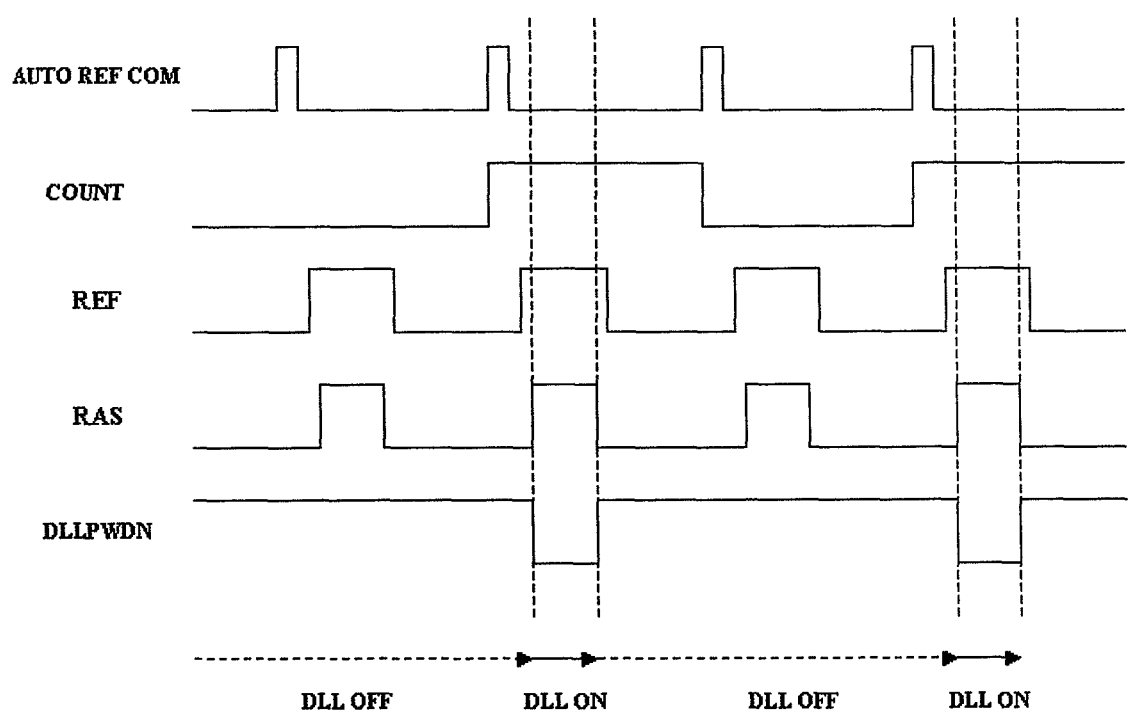
FIG. 20 is a timing chart of the DLL control circuit according to the seventh embodiment.
Figure 24:
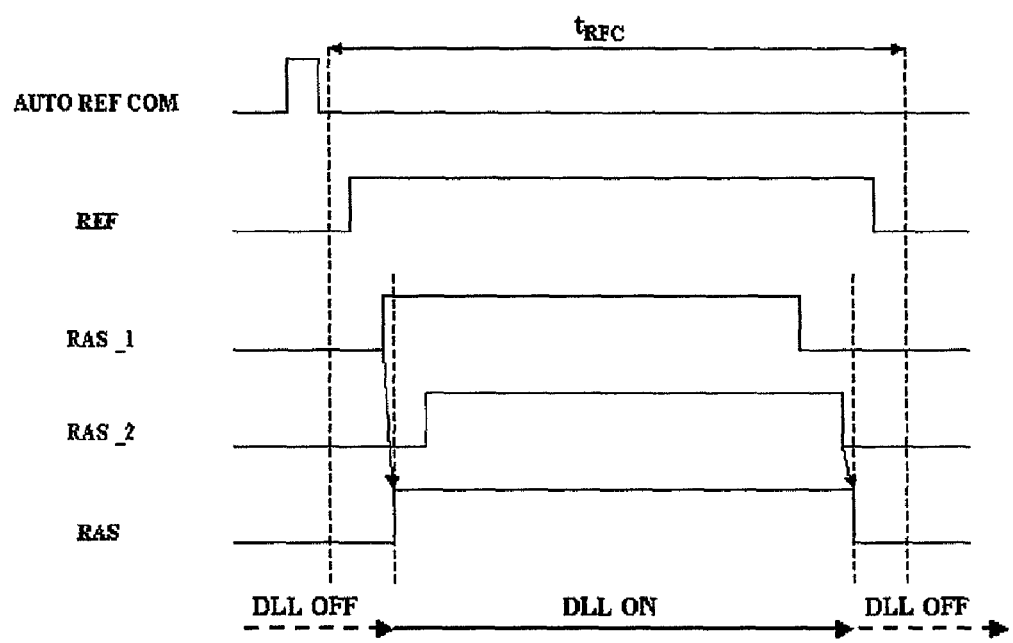
FIG. 24 is a timing chart illustrating a second example of operation of a DLL at the time of auto-refresh according to the related art.

FIG. 20 is a timing chart of the DLL control circuit 22b illustrated in FIG. 19. The signal COUNT in FIG. 20 is the output signal from the counter circuit CNT. This signal attains the high level whenever the auto-refresh command (AUTO REF COM) is activated twice. The signal DLLPWDN is the result of taking the NOR among the signal COUNT and the signals REF, RAS. Here control is exercised so as to cause the DLL circuit to operate once every two auto-refreshes.

It should be noted that various modifications are possible in which the DLL circuit is caused to operate once every three refreshes or twice every five refreshes, etc., by changing the structure of and the control of counting in the counter circuit CNT. Furthermore, by combining the seventh embodiment with the first to sixth embodiments, it is possible to further shorten the operating time period of the DLL circuit to achieve an even greater reduction in current consumption.

Though the present invention has been described in accordance with the foregoing embodiments, the invention is not limited to these embodiments and it goes without saying that the invention covers various modifications and changes that would be obvious to those skilled in the art within the scope of the claims.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor storage device comprising:
    an internal clock generator generating an internal clock signal in response to an activated state and stopping generation of the internal clock signal in response to a deactivated state;
    a memory cell array;
    a memory circuit responding to the internal clock signal to perform a data access operation on the memory cell array;
    a refresh circuit performing a refresh operation on the memory cell array a plurality of times; and
    a clock control circuit bringing the internal clock generator into the activated state in response to performing of at least one of the plurality of times of the refresh operation and into the deactivated state in response to performing of remaining one or ones of the plurality of times of the refresh operation.

2. The device as claimed in claim 1, wherein the refresh circuit performs the refresh operation the plurality of times each time correspondingly to one issuance of a refresh command.

3. The device as claimed in claim 2, wherein a plurality of addresses are refreshed in sequence to perform the refresh operation a plurality of times.

4. The device as claimed in claim 1, wherein the refresh circuit performs the refresh operation the plurality of times corresponding respectively to a plurality of issuances of a refresh command.

5. A semiconductor storage device comprising:
    a DLL circuit generating in a first state an internal clock signal in response to an external clock signal and stopping in a second state the generating of the internal clock signal;
    a memory cell array;
    a data access circuit providing access to the memory cell array in response to the internal clock signal;
    a refresh circuit activated in a refresh mode to initiate a refresh cycle operation for refreshing the memory cell array, wherein the refresh mode becomes active each time a refresh command is supplied to the semiconductor storage device and the refresh cycle operation is initiated a plurality of times each time the refresh mode becomes active; and
    a DLL control circuit controlling the DLL circuit to operate in the first state in response to the initiation of at least one of the plurality of times of the refresh cycle operation and to operate in the second state in response to the initiation of remaining one or ones of the plurality of times of the refresh cycle operation.

6. The device as claimed in claim 5, wherein the DLL control circuit includes a flip-flop circuit changing a state thereof each time the refresh cycle operation is initiated.

7. A semiconductor storage device comprising:
    a DLL circuit generating in a first state an internal clock signal in response to an external clock signal and stopping in a second state the generating of the internal clock signal;
    a memory cell array;
    a data access circuit providing access to the memory cell array in response to the internal clock signal;
    a refresh circuit activated in a refresh mode to initiate a refresh cycle operation for refreshing the memory cell array, wherein the refresh mode becomes active each time each of successive refresh commands is supplied to the semiconductor storage device and the refresh cycle operation is initiated at least once each time the refresh mode becomes active; and
    a DLL control circuit controlling the DLL circuit to operate in the first state in response to activation of the refresh mode responsive to one of the successive refresh commands and to operate in the second state irrespective of activation of the refresh mode responsive to a subsequent one or ones of the successive refresh commands.

8. The device as claimed in claim 7, wherein the DLL control circuit includes a counter changing a count value thereof each time the refresh command is supplied to the device.

* * * * *